(12) United States Patent
Olsson

(10) Patent No.: US 12,148,821 B2
(45) Date of Patent: Nov. 19, 2024

(54) SEMICONDUCTOR LAYER STRUCTURE

(71) Applicant: Epinovatech AB, Lund (SE)

(72) Inventor: Martin Andreas Olsson, Lund (SE)

(73) Assignee: Epinovatech AB, Lund (SE)

( * ) Notice: Subject to any disclaimer, the term of this patent is extended or adjusted under 35 U.S.C. 154(b) by 0 days.

(21) Appl. No.: 18/321,643

(22) Filed: May 22, 2023

(65) Prior Publication Data

US 2023/0327009 A1 Oct. 12, 2023

Related U.S. Application Data

(60) Division of application No. 17/806,400, filed on Jun. 10, 2022, now Pat. No. 11,695,066, which is a (Continued)

(30) Foreign Application Priority Data

Dec. 11, 2019 (EP) .................................... 19215267

(51) Int. Cl.
*H01L 29/20* (2006.01)
*H01L 29/04* (2006.01)
(Continued)

(52) U.S. Cl.
CPC ........ *H01L 29/7783* (2013.01); *H01L 29/045* (2013.01); *H01L 29/0676* (2013.01); (Continued)

(58) Field of Classification Search
None
See application file for complete search history.

(56) References Cited

U.S. PATENT DOCUMENTS 2,463,073 A 3/1949 Webb
4,103,325 A 7/1978 Hyman et al.
(Continued)

FOREIGN PATENT DOCUMENTS

CN 101621292 5/2012
CN 103477418 12/2013
(Continued)

OTHER PUBLICATIONS

International Search Report and Written Opinion of PCT/EP2020/085010, dated Feb. 19, 2021 in 14 pages.
(Continued)

*Primary Examiner* — Grant S Withers
(74) *Attorney, Agent, or Firm* — Knobbe, Martens, Olson & Bear, LLP

(57) ABSTRACT

Apparatuses and methods relating to semiconductor layer structures are disclosed. A method for producing a semiconductor layer structure ay involve providing a Si substrate comprising a top surface, forming a first semiconductor layer on the substrate, the first semiconductor layer comprising a plurality of vertical nanowire structures, arranged perpendicularly to the top surface of the substrate, the first semiconductor layer comprising AlN, and epitaxially growing a second semiconductor layer which laterally and vertically encloses the plurality of vertical nanowire structures thereby encapsulating dislocations in shells around the nanowires, wherein the second semiconductor layer comprises $Al_xGa_{1-x}N$, wherein $0 \leq x \leq 0.95$.

20 Claims, 12 Drawing Sheets

Related U.S. Application Data continuation of application No. PCT/EP2020/085010, filed on Dec. 8, 2020.

(51) Int. Cl.

| | |
|---|---|
| *H01L 29/06* | (2006.01) |
| *H01L 29/205* | (2006.01) |
| *H01L 29/66* | (2006.01) |
| *H01L 29/778* | (2006.01) |

(52) U.S. Cl.
CPC ........ *H01L 29/2003* (2013.01); *H01L 29/205* (2013.01); *H01L 29/66462* (2013.01); *H01L 29/7786* (2013.01); *H01L 29/7787* (2013.01); *H01L 29/7789* (2013.01)

(56) References Cited

U.S. PATENT DOCUMENTS

| | | | |
|---|---|---|---|
| 4,873,497 | A | 10/1989 | Kielmeyer |
| 7,250,359 | B2 | 7/2007 | Fitzgerald |
| 9,275,857 | B1 | 3/2016 | Hersee |
| 9,379,204 | B2 | 6/2016 | Fogel et al. |
| 11,469,300 | B2 | 10/2022 | Olsson |
| 2003/0165418 | A1 | 9/2003 | Ajayan |
| 2006/0134883 | A1 | 6/2006 | Hantschel |
| 2006/0189018 | A1 | 8/2006 | Yi |
| 2007/0108435 | A1 | 5/2007 | Harmon |
| 2007/0215899 | A1 | 9/2007 | Thomas |
| 2007/0295993 | A1 | 12/2007 | Chen et al. |
| 2008/0122418 | A1 | 5/2008 | Biere et al. |
| 2008/0153000 | A1 | 6/2008 | Salot et al. |
| 2008/0171424 | A1 | 7/2008 | Li |
| 2009/0269909 | A1 | 10/2009 | Kim |
| 2010/0176459 | A1 | 7/2010 | Wernersson et al. |
| 2010/0259186 | A1 | 10/2010 | Ernoux |
| 2010/0276664 | A1 | 11/2010 | Hersee |
| 2010/0314617 | A1 | 12/2010 | Ito |
| 2011/0020704 | A1 | 1/2011 | Fukuchi |
| 2011/0036396 | A1 | 2/2011 | Jayaraman |
| 2011/0140072 | A1 | 6/2011 | Varangis |
| 2011/0143472 | A1 | 6/2011 | Seifert |
| 2012/0001153 | A1 | 1/2012 | Hersee |
| 2012/0235117 | A1 | 9/2012 | Takashi et al. |
| 2013/0061747 | A1 | 3/2013 | Turnbull et al. |
| 2013/0175501 | A1 | 7/2013 | Hersee |
| 2013/0187627 | A1 | 7/2013 | Imada et al. |
| 2014/0008609 | A1 | 1/2014 | Chiu |
| 2014/0134773 | A1 | 5/2014 | Rakesh et al. |
| 2014/0197130 | A1 | 7/2014 | Lemke |
| 2014/0231870 | A1 | 8/2014 | Hoke |
| 2015/0014631 | A1* | 1/2015 | Ohlsson ............ H01L 21/02639 438/507 |
| 2015/0060996 | A1 | 3/2015 | Colinge |
| 2015/0076450 | A1 | 3/2015 | Weman |
| 2015/0084685 | A1 | 3/2015 | Hirose et al. |
| 2015/0118572 | A1 | 4/2015 | Lund et al. |
| 2015/0311072 | A1 | 10/2015 | Aagesen |
| 2015/0333216 | A1 | 11/2015 | Pourquire |
| 2016/0172305 | A1 | 6/2016 | Sato |
| 2016/0276433 | A1 | 9/2016 | Holland |
| 2017/0002471 | A1 | 1/2017 | Okamoto |
| 2017/0062213 | A1 | 3/2017 | Patolsky |
| 2017/0110332 | A1 | 4/2017 | Beveridge |
| 2017/0200820 | A1 | 7/2017 | Conway et al. |
| 2017/0229569 | A1 | 8/2017 | Chowdhury et al. |
| 2017/0257025 | A1 | 9/2017 | Meiser |
| 2017/0323788 | A1 | 11/2017 | Mi |
| 2019/0081164 | A1 | 3/2019 | Shrivastava |
| 2019/0284706 | A1 | 9/2019 | Takeda et al. |
| 2019/0356278 | A1 | 11/2019 | Smith |
| 2019/0393104 | A1 | 12/2019 | Ando |
| 2021/0265632 | A1 | 8/2021 | Olsson |
| 2021/0327712 | A1 | 10/2021 | Olsson |
| 2022/0231298 | A1 | 7/2022 | Olsson |
| 2022/0302293 | A1 | 9/2022 | Olsson |

FOREIGN PATENT DOCUMENTS

| | | |
|---|---|---|
| CN | 105914232 | 8/2016 |
| CN | 106549050 | 3/2017 |
| CN | 110336028 | 3/2021 |
| EP | 2571065 | 3/2013 |
| EP | 2816729 | 12/2014 |
| EP | 284700 | 1/2015 |
| GB | 2520687 | 6/2015 |
| JP | 2008057383 | 3/2008 |
| JP | 2010232423 | 10/2010 |
| JP | 2014217252 | 11/2014 |
| WO | WO 95/08452 | 3/1995 |
| WO | WO 2010/100599 | 9/2010 |
| WO | WO 2012/105901 | 8/2012 |
| WO | WO 2017/111844 | 6/2017 |
| WO | WO 2017/213644 | 12/2017 |

OTHER PUBLICATIONS

Alamo et al., III-V CMOS: the key to sub-10 nm electronics?, Microsystems Technology Laboratories, MIT, 2011 MRS Spring Meeting and Exhibition Symposium P: Interface Engineering for Post-CMOS Emerging Channel Materials.

Anonymous, "High-electron-mobility transistor—Wikipedia", Mar. 6, 2020 (Mar. 6, 2020), XP055808423, Retrieved from the Internet: URL:https://en.wikipedia.org/w/index.php?title=High-electron-mobility transistor&old id=944233239, retrieved on May 27, 2021 6 pages.

Anonymous, "Phase-shift oscillator Wikipedia" Apr. 7, 2019 (Apr. 7, 2019), XP055733459, Retrieved from the Internet: URL:https://en.wikipedia.org/w/index.php?title=Phase-shift- oscillator&oldid=89138949 5, retrieved on Sep. 23, 2020 in 3 pages.

Asghar Asgari, "Negative Differential Capacitance of AlGaN/GaN Heterostructure in Presence of InN Quantum Dots", SPIE, PO Box 10 Bellingham WA 98227-0010 USA, Jan. 1, 2008.

Cai et al, Monolithically Integrated Enhancement-and Depletion-Mode AlGaN/GaN HEMT for gaN Digital Integrated Circuits, vol. 53, No. 9, Sep. 1, 2006 (Sep. 1, 2006), pp. 2223-2230.

Chebrolu et al., "Recent progress in quantum dot sensitized solar cells: an inclusive review of photoanode, sensitizer, electrolyte, and the counter electrode", Journal of Materials Chemistry C 2019, pp. 4911-4933.

Dahal et al., "Realizing InGaN monolithic solar-photoelctrochemical cells for artificial photosynthesis", Appl. Phys, Lett. 104, 143901, (2014); Published Onlines: Apr. 9, 2014.

Enthaler et al, "Carbon dioxide and formic acid-the couple for environmental-friendly hydrogen storage?", Energy & Enviormental Science, 2010 pp. 1207-1217.

Faunce et al., "Nanotechnology, Plasma, Hydrogen from Artificial Photosynthesis, and Fuel Cells: Powering the Developing World to the Sustainocene", Nanotechnology Toward the Sustoinocene, Chapter 11, pp. 241-257.

Fujii et al., "Photoelectrochemical Properties of Ingan for H2 Generation From Aqueous Water", Japanese Journal of Applied Physics, Japan Society of Applied Physics, JP, vol. 44, No. 10, Oct. 11, 2005 (Oct. 11, 2005), pp. 7473-7435.

Gust et al., "Solar Fukes via Artificial Photosynthesis", Department of Chemistry and Biochemestry and Center for Bioenergy and Photosynthesis, Arizona State University, Jul. 17, 2009, in 9 pages.

Iqbal et al. "Reactive Sputtering of Aluminum Nitride Thin Files for Piezoeletric Applications: A Review", Sensors, vol. 18, No. 6, Jun. 2018 in 21 pages.

Kumar et al. "Quantum dot activated indium gallium nitride on silicon as photoanode for solar hydrogen generation", Communcations Chemistry, in 7 pages.

Lin et al., "Physical and electrical characteristics of AlGaN/GaN metal-oxide-semiconductor high-electron-mobility transistors with rare earth Er2O3 as a gate dielectric", Thin Solid Films, vol. 544, Oct. 2013 (Oct. 2013), pp. 526-529.

Mitsunari et al., "Single-crystalline semipolar GaN on Si(001) using a directional supttered AlN intermediate layer", Journal of Crystal Growth, 2015 in 4 pages.

(56) References Cited

OTHER PUBLICATIONS

Mukhopadhyay, P. "Comparative DC Characteristic Analysis of AlGaN/GaN HEMTs Grown on Si(111) and Sapphire Substrates by MBE" Jour. of Elec. Mat. vol. 43, No. 4, Feb. 14, 2014 pp. 1263-1270 (Year: 2014).
Nainani, "High-Performance III-V PMOSFET", May 2011, in 131 pages.
Naveed ul Hassan Alvi et al., "InN/InGaN Quantum Dot Photoelectrode: Efficient Hydrogen Generation by Water Splitting at Zero Voltage", Nano Energy, vol. 13, Mar. 6, 2015 (Mar. 6, 2015), pp. 291-297.
Park, J. "Comparison of AlGaN/GaN High Electron Mobility Transistor with AlN or GaN as a cap layer" Conference paper proceedings on Research Gate available online at address recited in the Office Action as of Jul. 14, 2015 pp. 1-2 (Year: 2015).
Ramakrishna et al. "Nitrogen doped CNTs supported Palladium electrocatalyst for hydrogen evolution reaction in PEM water electrolyser", International Journal of Hydrogen Energy, 2016 pp. 20447-20454.
Shibata, D. "1. 7 kV/ 1.0 mQcm2 Normally-off Vertical GaN Transistor on GaN substrate with Regrown p-GaN/AlGaN/GaN SemipolarGate Structure" IEEE Int. Elec. Dev. Meet. IEDM 2016, Feb. 2, 2017 pp. 248-251 (Year: 2016).
Shrestha et al. "Optimal design 5,9 of the multiple-apertures-GaN-based vertical HEMTs with SiO2 current blocking layer", Journal of Computational Electronics, Springer us, Boston, vol. 15, No. 1. Aug. 7, 2015 (Aug. 7, 2015pp. 154-162.
Sritoma et al., IIA Novel GaN-Hemt based Inverter and Cascade Amplifier 11 , 2018 IEEE Electron Devices Kolkata Conference (EDKCON), IEEE, Nov. 24, 2018 (Nov. 24, 2018), pp. 465-469.
Sundaram et al, "Single-crystal nanopyramidal BGaN by nanoselective area growth on AlN/Si(111) and GaN templates"., Nanotechnology, vol. 27 (2016) 7 pages.
Tavares et al., "Implementation of a high frequency PWM signal in FPGA for GaN power devices switching", 2017 Brazilian Power Electronics Conference (COBEP), IEEE, Nov. 19, 2017 (Nov. 19, 2017), pp. 1-7.
Tripathy et al., "AlGaN/GaN two-dimensional-electron gas heterostructures on 200 mm diameter Si(111)", Applied Physics Letters, 101, 082110 (2012) https://doi.org/10.1063/1.4746751 Submitted: Feb. 7, 2012 , Accepted: Aug. 1, 2012 , Published Online: Aug. 23, 2012.
Wang et al, Germanium-Assisted Direct Growth of Graphene on Arbitrart Dielectric Substrates for Heating Device, Nano Micro Small, vol. 13, No. 28 Jul. 26, 2017.
Lan et al., "Efficienty improvement of the Light-emitting diodes by the lateral overgrowth GaN on an AlN nanorod template," 14th International Conference on Solid State Lighting and LED-based Illumination Systems 957100 SPIE, Sep. 8, 205 in 7 pages.

* cited by examiner

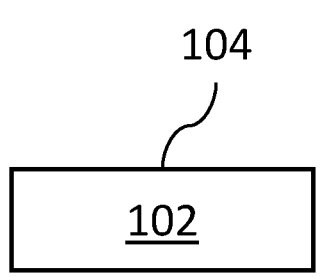
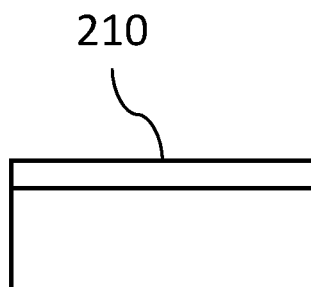
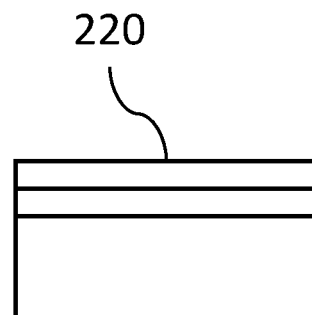
Fig. 10a  Fig. 10b  Fig. 10c
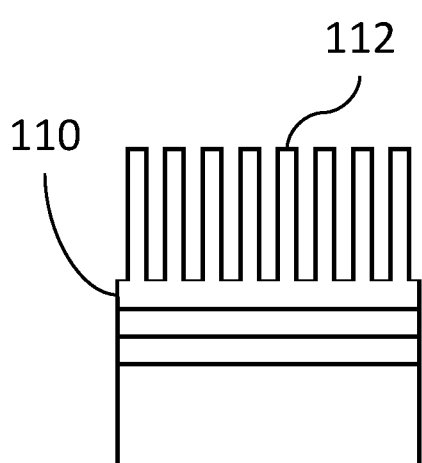
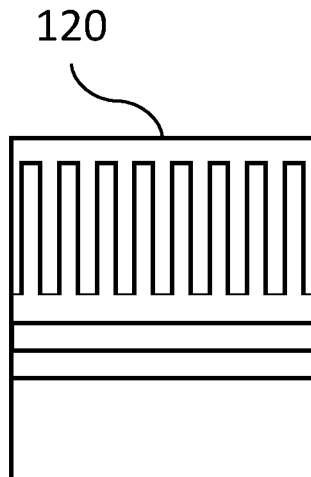
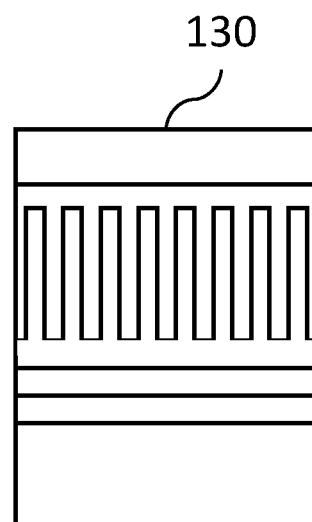
Fig. 10d  Fig. 10e  Fig. 10f
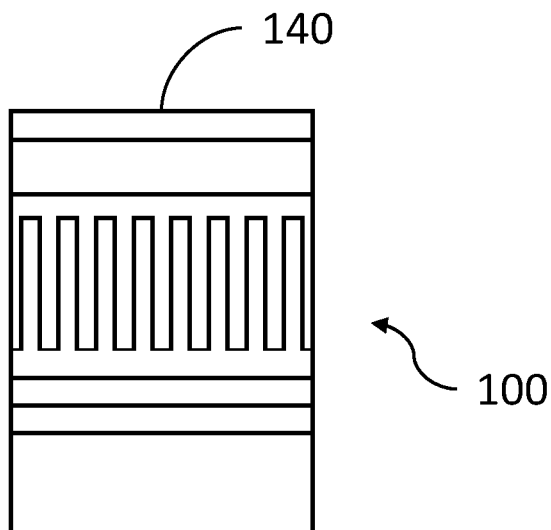
Fig. 10g

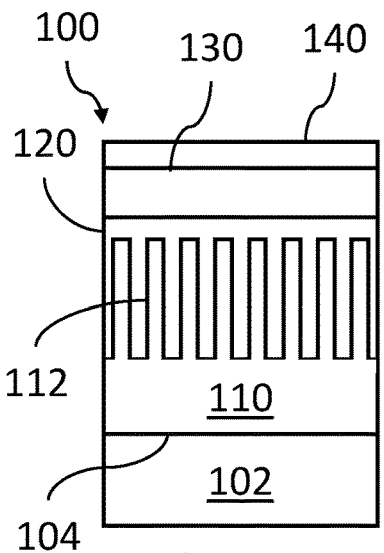
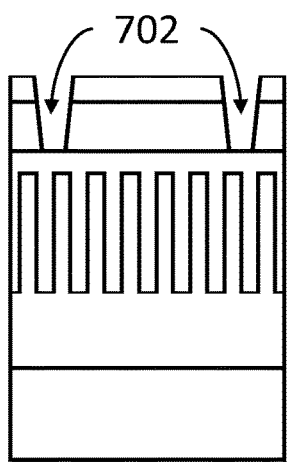
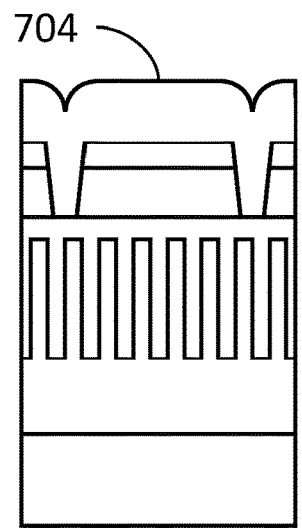
Fig. 12a    Fig. 12b    Fig. 12c
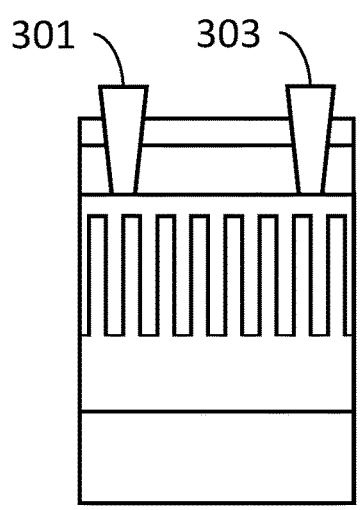
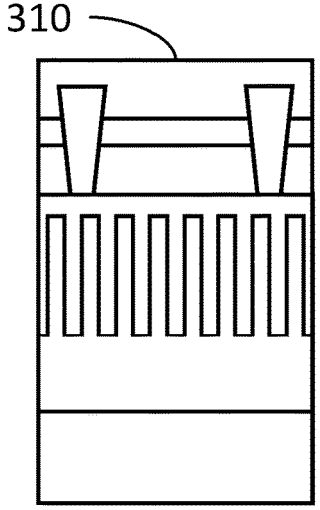
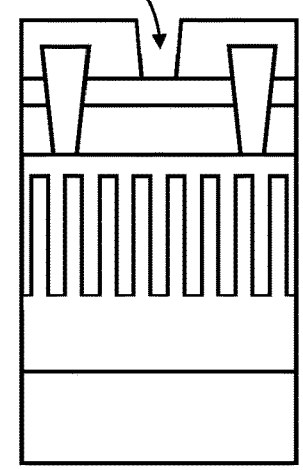
Fig. 12d    Fig. 12e    Fig. 12f
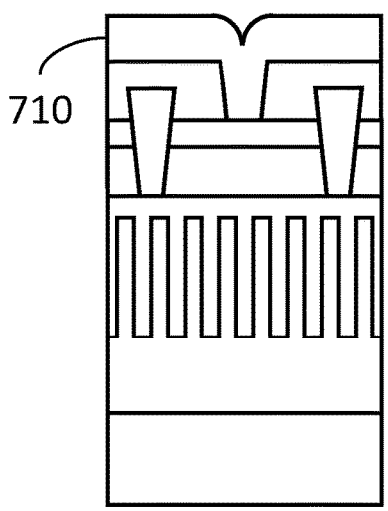
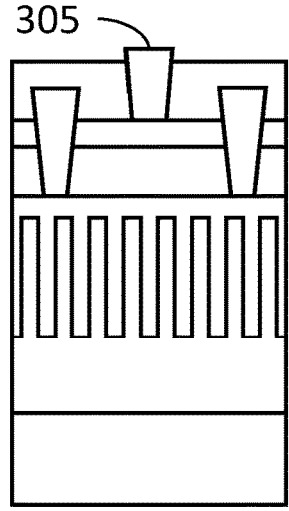
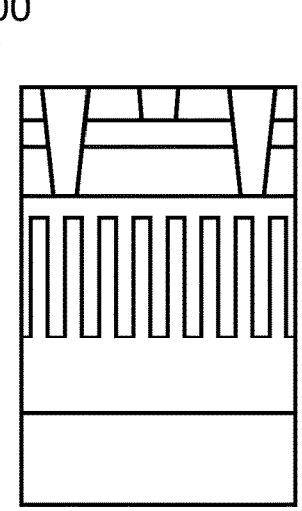
Fig. 12g    Fig. 12h    Fig. 12i

SEMICONDUCTOR LAYER STRUCTURE

TECHNICAL FIELD

The present invention relates to nitride semiconductor layer structures, electronic devices based thereon, and methods of producing such structures and devices.

BACKGROUND

Nitride semiconductors, i.e. compounds of elements from the third group of the periodic table of elements and nitrogen, provide numerous advantages compared to silicon. Devices based thereon provide a promising candidate for replacing silicon-based electronic devices. For example, such devices may offer faster switching speeds, increased electron mobility, lower resistances, larger breakdown voltages, etc.

Yet, a persistent issue with nitride devices is how to produce the high-quality, e.g. low defect, material required for obtaining all the advantages of using nitrides. Using bulk nitride materials is most often not a viable option. This may be due to nitrides, having no obvious alternative to the Czochralski process, which enables efficient formation of monocrystalline silicon. Furthermore, the relative material abundance of elemental silicon allows for using bulk silicon material when forming wafer and substrates. The same abundance cannot be said to exist for nitrides. As such, alternatives are required to efficiently produce nitride semiconductor materials and devices.

Forming nitride layers and structures onto a silicon substrate may be beneficial as less nitride material may be required and as electronic devices formed thereon may be more closely integrated with silicon electronics formed on the same substrate. Using silicon substrates further allows for using existing fabrication tools and infrastructure to a greater extent.

However, due to factors such as crystal lattice constants and thermal expansion coefficients being different for silicon and nitride materials, just forming a nitride layer onto a silicon substrate will most often result in cracks, defects and overall poor crystal quality of the formed nitride layers due to e.g. mismatching material properties.

Various methods to amend these deficiencies include using thick and complex buffer layer structures to filter out crystal defects. Sometimes this may mean an aluminium gallium nitride layer structure with a thickness exceeding 5 µm. Such methods, in addition to often being complicated to perform, may still not provide satisfactory advances for the creation of high-quality nitride semiconductor materials. Sapphire and silicon carbide may sometimes be used as substrates for nitrides. However, these are still not in abundant supply and may not provide adequate material property matching for all types of devices. There is thus need for improvements within the technical field.

SUMMARY OF THE INVENTION

An object of the present invention is to solve or at least mitigate some of the above-mentioned issues.

According to a first aspect of the present invention, there is provided a semiconductor layer structure comprising:
- a Si substrate having a top surface;
- a first semiconductor layer arranged on said substrate, the first semiconductor layer comprising a plurality of vertical nanowire structures arranged perpendicularly to said top surface of said substrate, the first semiconductor layer comprising AlN;
- a second semiconductor layer arranged on said first semiconductor layer laterally and vertically enclosing said nanowire structures, the second semiconductor layer comprising $Al_xGa_{1-x}N$, wherein $0 \leq x \leq 0.95$;
- a third semiconductor layer arranged on said second semiconductor layer, the third semiconductor layer comprising $Al_yGa_{1-y}N$, wherein $0 \leq y \leq 0.95$; and
- a fourth semiconductor layer arranged on said third semiconductor layer, the fourth semiconductor layer comprising GaN.

Elemental materials are referred to herein by their element symbol or abbreviation. E.g. silicon may be referred to as Si. Compounds comprising a plurality of elements may be referred to herein by combinations of element symbols. E.g. gallium nitride may be referred to as GaN and aluminium nitride may be referred to as AlN. Some compounds may be provided with ratios of their relative elemental composition. E.g. aluminium gallium nitride may be referred to as $Al_xGa_{1-x}N$ or $Al_yGa_{1-y}N$ wherein x and y are variables that may assume values from 0 to 1. The subscripted affix indicates the relative ratio of the preceding element. If e.g. x=0.5 or $Al_{0.5}Ga_{0.5}N$, it may be understood that 25% of the atomic content is aluminium, Al, 25% is gallium, Ga, and 50% is nitrogen, N. Just AlGaN, without the ratios, may alternatively refer aluminium gallium nitride of varying compositions. In general, layers or structures said to comprise a particular material or element, may be understood as at least partially comprising or substantially consisting of that material or element.

The layers of the semiconductor layer structure may be understood as ordered in a bottom up order. In this context the term "on" refers to arranging layers or structures above or onto other layers or structures. The term "vertical" refers to the direction in which layers are arranged on each other. The vertical direction considered perpendicular or normal to the top surface of the substrate, wherein the top surface may be considered to be substantially planar. The term "laterally" refers to any direction being perpendicular to said vertical direction.

The inventor has realized that a nitride semiconductor layer structure comprising a plurality of vertical nanowire structures that are laterally and vertically enclosed by a different semiconductor material may promote encapsulation and accumulation of dislocations along the shell of the nanowire structures and hence provide effective filtering of and reduce the amount of material defects and cracks that propagate to the surface of the semiconductor layer structure. A different semiconductor material may be understood as e.g. a material with a different elemental composition, or content, compared to that of the vertical nanowire structures.

Encapsulated dislocations may be especially prone to propagating laterally from the nanowire structures, in the so-called M-direction of the wurtzite crystal structure, commonly observed for nitride semiconductor materials. As the dislocations laterally coalesce with dislocations from other nanowire structures a dislocation free thin-film may form. The thin-film may nucleate from the nanowire structures in the vertical direction, or the so-called C-direction of the wurtzite crystal structure. The dislocation free thin-film may form such that the encapsulated or trapped dislocations cannot propagate and cause cracks to form, strengthening the thin-film and the layer structure in the process. As such, high-quality nitride semiconductor material may be provided on Si substrates for forming electronic devices with improved properties.

According to the present invention dislocations in the thin-film may be prevented from propagating vertically to e.g. the above AlGaN/GaN interface if they first need to pass into another nanowire structure of higher elastic modulus than the two-dimensional coalesced layer in between the vertical nanowire structures. The finer the nanowire structure the larger area of blocking dislocation propagation. AlGaN overgrowth encapsulates dislocations in shells around the nanowires, which in particular grows in the M direction of the wurtzite crystal structure. A thin-film may thereafter be grown in the main C-direction. These nanowire shells may unite laterally into a thin-film that then begins to grow in the C-direction. From the coalesced thin-film with embedded nanowire structures, a dislocation-free thin-film may nucleate as the trapped dislocations may be unable to spread in the C-direction in such a way that cracking will occur, which strengthens the thin-film.

Furthermore, the inventor has realized that such a layer structure may be made thinner, and thus less complex and material intensive, than conventional buffer layer approaches. The layer structure may additionally provide beneficial production scalability and compatibility with conventional fabrication tools and infrastructure. The layer structure may be applied for wafer sizes up to, or even exceeding, 12". The semiconductor layer structure may further comprise a bottom semiconductor layer, arranged intermediate to the top surface of the substrate and the first semiconductor layer, the bottom semiconductor layer comprising AlN.

Generally, the word "intermediate" may refer to arranging a layer or structure between two other layers or structures. Intermediate arrangement may e.g. be vertical and/or lateral. Intermediate may further relate to chronology of steps and events. E.g. a second step of a method may be performed intermediate to a first step and a third stop of the same method.

By including the bottom semiconductor layer comprising AlN in the semiconductor layer structure a smoother material transition from the Si substrate may be achieved.

The semiconductor layer structure may further comprise an intermediate semiconductor layer, arranged intermediately to the bottom semiconductor layer and the first semiconductor layer, the intermediate semiconductor layer comprising AlN.

As with the above, inclusion of the intermediate semiconductor layer comprising AlN in the semiconductor layer structure, may result in a smoother transition from the Si substrate.

The top surface of the Si substrate may have a Miller index of $\{111\}$.

The notation $\{111\}$ denotes a set of all planes that are equivalent to the plane with the Miller index (111). The top surface may further be understood to be stretched out perpendicularly to any crystal direction <111>. The notation <111> denotes a set of all crystal directions that are equivalent to the crystal direction [111].

A Si substrate oriented as such, may provide an ideal crystal growing direction for wurtzite nitride semiconductors. Essentially, this may promote the nanowire structures to be efficiently oriented vertically, along the wurtzite [0001] crystal direction, or any equivalent direction <0001>. These directions correspond to the [111] and <111> directions of the Si substrate.

Said fourth semiconductor layer may have a vertical thickness in the range 1-5 nm.

The fourth semiconductor layer may be used as an active device layer and may thus need to be very thin. The semiconductor structure may allow for such a thin structure to be formed without sacrificing material quality. By featuring such a thin layer, less Ga may be required for producing it. This is relevant as Ga is a relatively rare element compared to e.g. Al, N, or Si. Thin layers may also be produced in less time, enabling a larger production throughput. The second semiconductor layer may comprise at least two vertically arranged sublayers, wherein x for a first sublayer is greater than x for a second sublayer, wherein the second sublayer is located further from the substrate than the first sublayer.

As such, the second semiconductor layer structure may essentially be vertically graded towards a lower Al content for layers further from the Si substrate and/or the base of the nanowire structures. The inventor has realized that a structure comprising two or more, e.g. three, different sublayers with a graded Al and Ga content provides improved encapsulation of dislocations. Hence, a higher quality nitride material may be achieved. Additionally, a more gradual change of material content may be preferable as material properties such as e.g. lattice constants and thermal expansion coefficients may be changed more gradually as well. It should be understood that conventional GaN thin-films on silicon may be excessively thick on the order of 3-10 microns as a consequence of necessary layers of AlGaN alloys for strain relaxation underneath the GaN. According to the present invention thicker homoepitaxial GaN may be deposited/grown on a silicon substrate to improve crystal quality without all of the previously necessary and tedious AlGaN layers.

According to a second aspect of the present invention there is provided a high-electron-mobility transistor, HEMT, device comprising:
  the semiconductor layer structure according to the first aspect of the present invention;
  a metallic source contact arranged directly adjacent on the second semiconductor layer;
  a metallic drain contact arranged directly adjacent on the second semiconductor layer, wherein the drain contact is separate from the source contact; and
  a metallic gate contact arranged on the fourth semiconductor layer, wherein the gate contact is arranged laterally between the source and drain contacts, and wherein the gate contact is separate from the source and drain contacts.

A layer or structure that is arranged directly adjacent on may be understood as being arranged above another layer or structure in the vertical direction as well as the above layer or structure sharing a physical interface with the below layer or structure. Such a physical interface may be configured to provide conductive contact, i.e. allow electron and/or hole transport, across the interface. Conductive contact may refer to e.g. ohmic contact, Schottky contact, and/or contact across a pn-junction or tunnel junction.

HEMTs enable higher switching frequencies and improved high power characteristics compared the conventional metal oxide semiconductor field effect transistor, MOSFET. This may largely be attributed to the substantially two-dimensional electron and/or hole transport, through the channel of such a device. The channel of a HEMT, often referred to as a two-dimensional electron gas, 2DEG, typically resides at a heterojunction interface between two semiconductor materials with slightly different band gap size.

For a nitride HEMT, extremely thin layers, sometimes as thin as 10-30 Å, may be required, or at least preferable, for creating the necessary heterojunctions at the AlGaN/GaN interfaces. Such thin layers may need to be created with a very high crystal quality semiconductor material. Therefore, it is of importance to encapsulate the dislocations to prevent them from interfering with the AlGaN/GaN interface and hence negatively affecting the performance of the transistor channel.

In general, the material quality of the nitride semiconductor layers and structures correspond to the performance of the devices, e.g. HEMTs formed thereon. The first aspect may provide a suitable, high quality semiconductor layer structure for producing nitride HEMTs with improved characteristics and performance.

The fourth semiconductor layer may be arranged as a vertical fin, wherein the vertical fin is arranged directly adjacent on the third semiconductor layer, wherein the gate contact is arranged to laterally and vertically enclose the vertical fin, and wherein the vertical fin comprises p-doped GaN.

Such p-doping may be achieved by inclusion of small amounts of impurity atoms, in the vertical fin GaN crystal. The p-doped vertical fin facilitates better electrostatic gate control for switching the channel on and off, particularly at high frequencies, currents, and/or voltages for normally-OFF operation. The p-doped GaN vertical fin may further be used to alter the threshold voltage for GaN HEMTs operating in normally-OFF mode.

According to a third aspect of the present invention there is provided a method for producing a semiconductor layer structure, the method comprising:
 providing a Si substrate comprising a top surface;
 forming a first semiconductor layer on said substrate, the first semiconductor layer comprising a plurality of vertical nanowire structures, arranged perpendicularly to said top surface of said substrate, the first semiconductor layer comprising AlN;
 depositing a second semiconductor layer on the substrate structure, laterally and vertically enclosing said nanowire structures, wherein the second semiconductor layer comprises $Al_xGa_{1-x}N$, wherein $0 \leq x \leq 0.95$;
 depositing a third semiconductor layer on said second semiconductor layer, the third semiconductor layer comprising $Al_yGa_{1-y}N$, wherein $0 \leq y \leq 0.95$; and
 depositing a fourth semiconductor layer on said third semiconductor layer, the fourth semiconductor layer comprising GaN.

Steps of forming may generally refer to any way of creating a layer or structure by removing existing material, adding new material, and/or altering existing material. Depositing generally refers to adding new material onto existing layers and/or structures.

Such a method may be utilized to form a semiconductor layer structure according to the first aspect of the present invention. Hence, similar advantages and beneficial effects may be expected. Additionally, using AlN for the first semiconductor layer and the nanowire structures may be advantageous as AlN may be deposited with good crystallinity onto Si substrates through e.g. plasma processing or sputtering.

Additionally, by sputtering AlN instead of epitaxially forming it, reactor contamination may be largely avoided as Al tends to remain in the memory of the reactor, thus contaminating the material composition of the consequently grown layers.

Forming said plurality of vertical nanowire structures of said first semiconductor layer may comprise:
 depositing the first semiconductor layer on the substrate; and
 etching the plurality of vertical nanowire structures from the first semiconductor layer.

Etching, in this context, may refer to removing material selectively. The non-removed material may thus be considered the vertical nanowire structures.

Etching the plurality of nanowire structures from the first layer may be advantageous in reducing the thickness of the required buffer for high quality GaN layer, which may in turn at least reduce or eliminate the bowing of the Si substrate caused by a large GaN layer thickness.

Forming said plurality of vertical nanowire structures may comprise epitaxially forming the plurality of vertical nanowire structures on the substrate.

Epitaxially forming may herein refer to formation of layers and structures by epitaxial crystal growth.

Such methods may also be advantageously employed to produce the vertical nanowires structures using existing fabrication tools and infrastructure.

The method may further comprise depositing a bottom semiconductor layer intermediate to providing the substrate and forming the first semiconductor layer, the bottom semiconductor layer comprising AlN.

The method may further comprise depositing an intermediate semiconductor layer intermediate to depositing the bottom semiconductor layer and forming the first semiconductor layer, the intermediate semiconductor layer comprising AlN.

Such method variations, concerning bottom and intermediate AlN layers, may provide similar advantages as those of the corresponding variation of the first aspect.

Forming said second semiconductor layer may comprise:
 forming a first sublayer on the first semiconductor layer; and
 forming a second sublayer on the first sublayer, wherein x for the first sublayer is greater than x for the second sublayer.

Such a method variation may provide similar advantages as those of the corresponding variation of the first aspect.

According to an exemplifying embodiment, the first layer comprising AlN is sputtered, for example magnetron sputtered using and Ar/N2 plasma on the substrate, while the fourth layer comprising GaN is epitaxially grown for instance by means of MOCVD.

According to this embodiment, the second layer may be magnetron sputtered on the first layer. Alternatively, the second layer may be epitaxially grown for instance by means of MOCVD.

The nanowire structures may be patterned using UV lithography, and etched from the second layer.

According to this embodiment, the third layer comprising AlGaN may be magnetron sputtered on the second layer. Alternatively, the third layer may be epitaxially grown for instance by means of MOCVD.

Magnetron sputtering layers comprising Al may reduce reactor contamination, hence hindering contamination of the following, for instance the GaN layer in which purity and crystal composition is vital to device performance.

According to a fourth aspect of the present invention there is provided a method for producing a high-electron-mobility transistor device, the method comprising:
 the steps of the method for producing a semiconductor layer structure according to the third aspect of the present invention;
 forming at least two trenches through the third and fourth semiconductor layers by etching away portions of said third and fourth semiconductor layers;

depositing a first metallic layer into the trenches and on the second semiconductor layer;

forming a metallic source contact and a metallic drain contact, in the trenches, by etching away portions of the first metallic layer;

forming an oxide layer on the source and drain contacts;

forming a gate trench through the oxide layer, between and separate from the at least two trenches through the third and fourth semiconductor layers, by etching away a portion of the oxide layer;

depositing a second metallic layer into the gate trench; and forming a metallic gate contact, in the gate trench, by etching away portions of the second metallic layer.

Such a method may be employed to produce HEMTs according to the second aspect of the present invention. Hence, similar advantages and beneficial effects may be expected.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description.

Hence, it is to be understood that this invention is not limited to the particular component parts of the device described or acts of the methods described as such device and method may vary. It is also to be understood that the terminology used herein is for purpose of describing particular embodiments only and is not intended to be limiting.

It must be noted that, as used in the specification and the appended claims, the articles "a," "an," "the," and "said" are intended to mean that there are one or more of the elements unless the context clearly dictates otherwise. Thus, for example, reference to "a device" or "the device" may include several devices, and the like. Furthermore, the words "comprising", "including", "containing" and similar wordings does not exclude other elements or steps.

BRIEF DESCRIPTION OF THE DRAWINGS

The above and other aspects of the present invention will, in the following, be described in more detail with reference to appended figures. The figures should not be considered limiting; instead they should be considered for explaining and understanding purposes.

As illustrated in the figures, the sizes of layers and regions may be exaggerated for illustrative purposes and, thus, are provided to illustrate the general structures. Like reference numerals refer to like elements throughout.

Cross section figures may primarily be considered as schematic illustrations. Devices, layers, and/or structures therein should not be considered to scale relative to each other. Furthermore, the cross sections may be considered as viewing the devices, layers, and/or structures from a lateral point of view.

Flowchart boxes with dashed borders may be considered as optional and/or additional steps featured for some variations of the methods.

Figure 1:
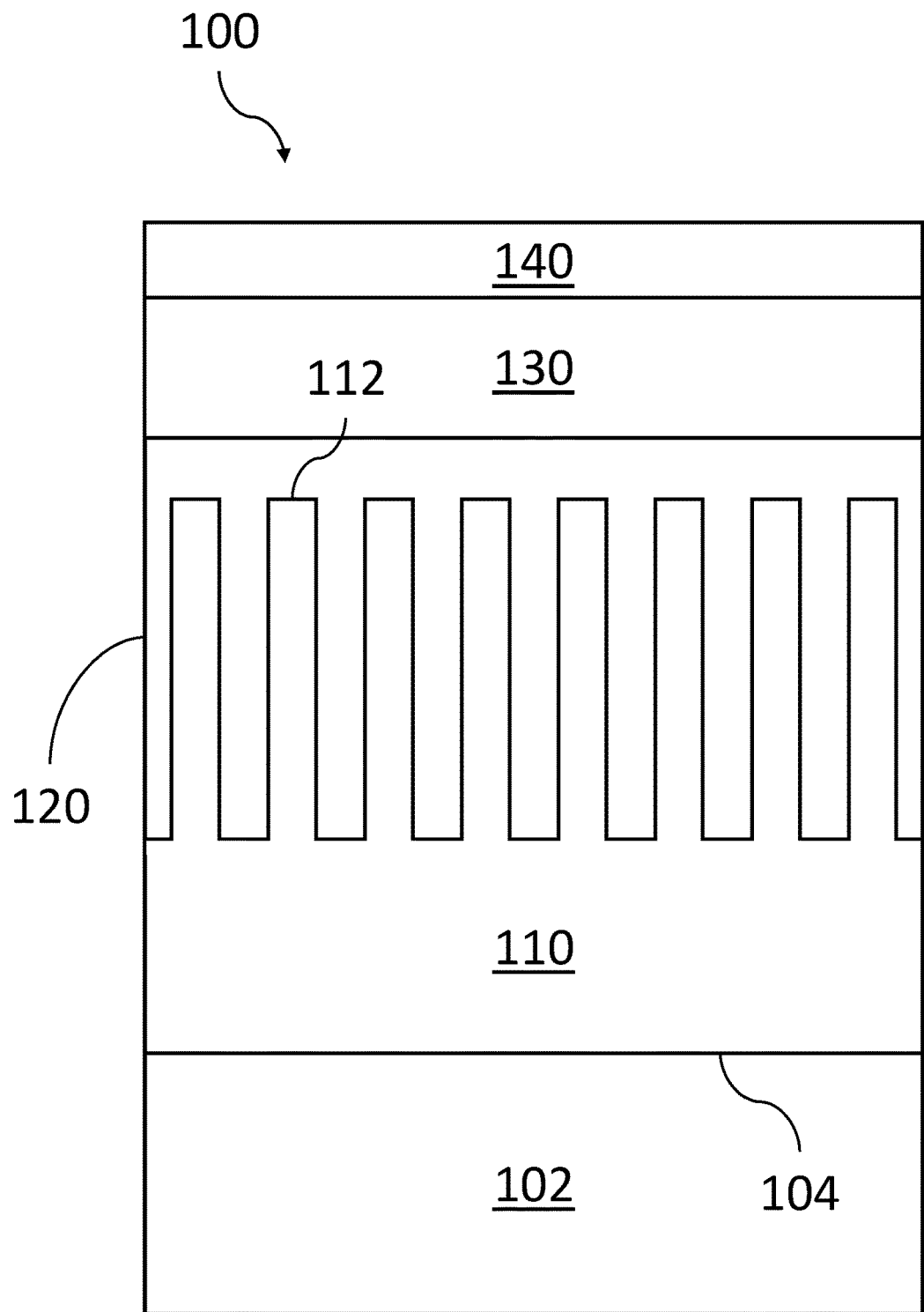

FIG. 1 illustrates a cross section of a semiconductor layer structure according to the present invention.

Figure 2:
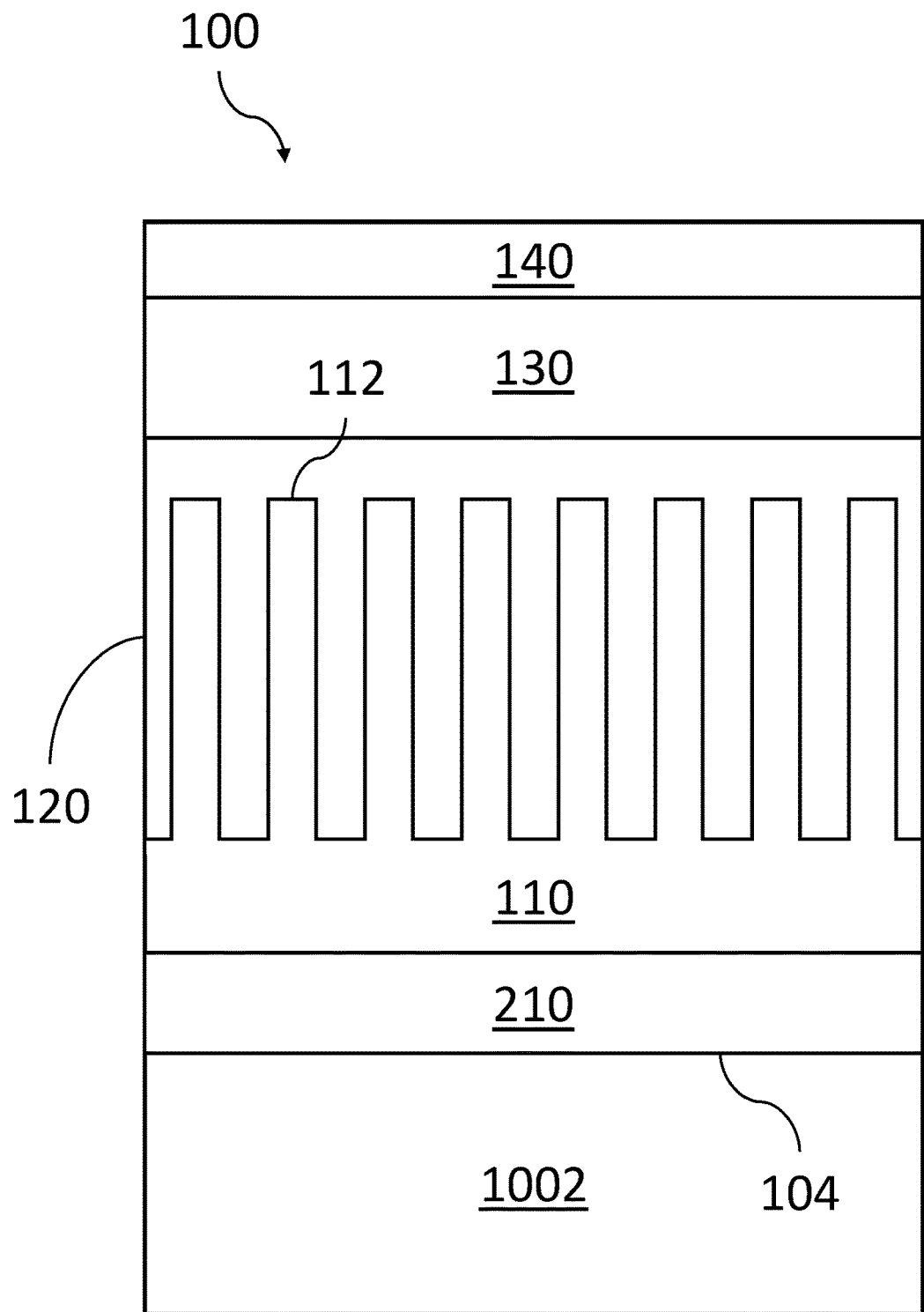

FIG. 2 illustrates a cross section of a semiconductor layer structure variation.

Figure 3:
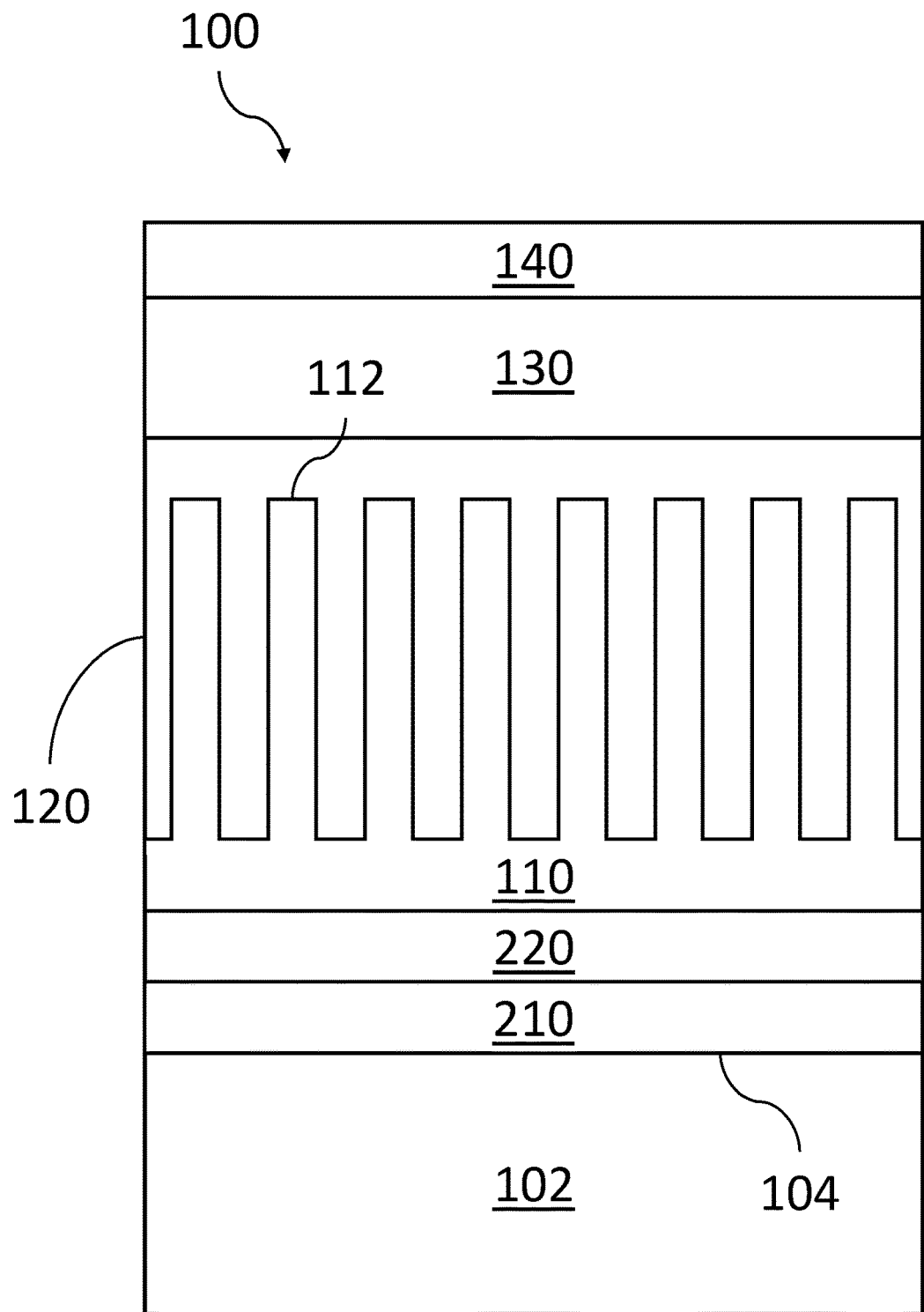

FIG. 3 illustrates a cross section of a semiconductor layer structure variation.

Figure 4:
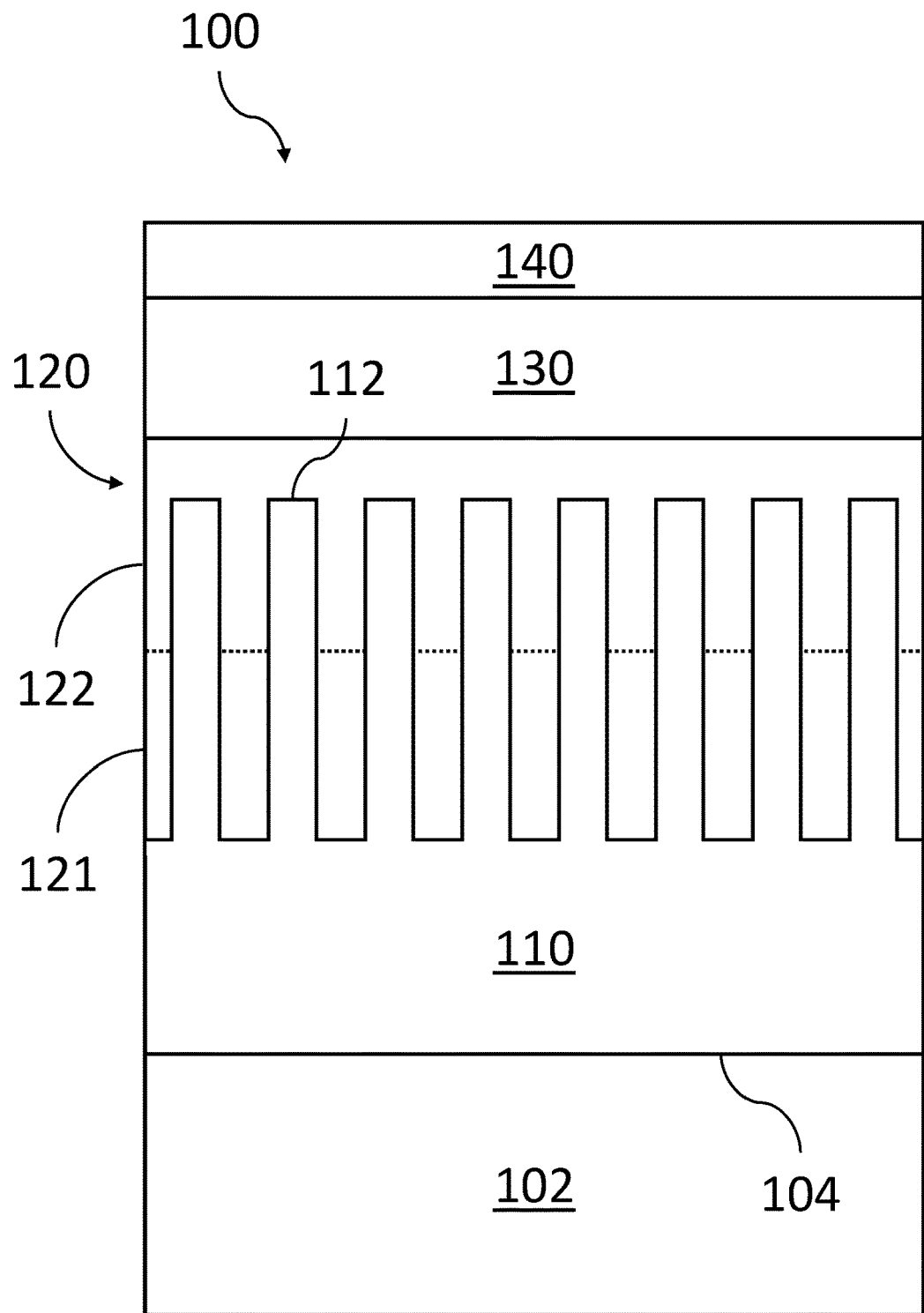

FIG. 4 illustrates a cross section of a semiconductor layer structure variation.

Figure 5:
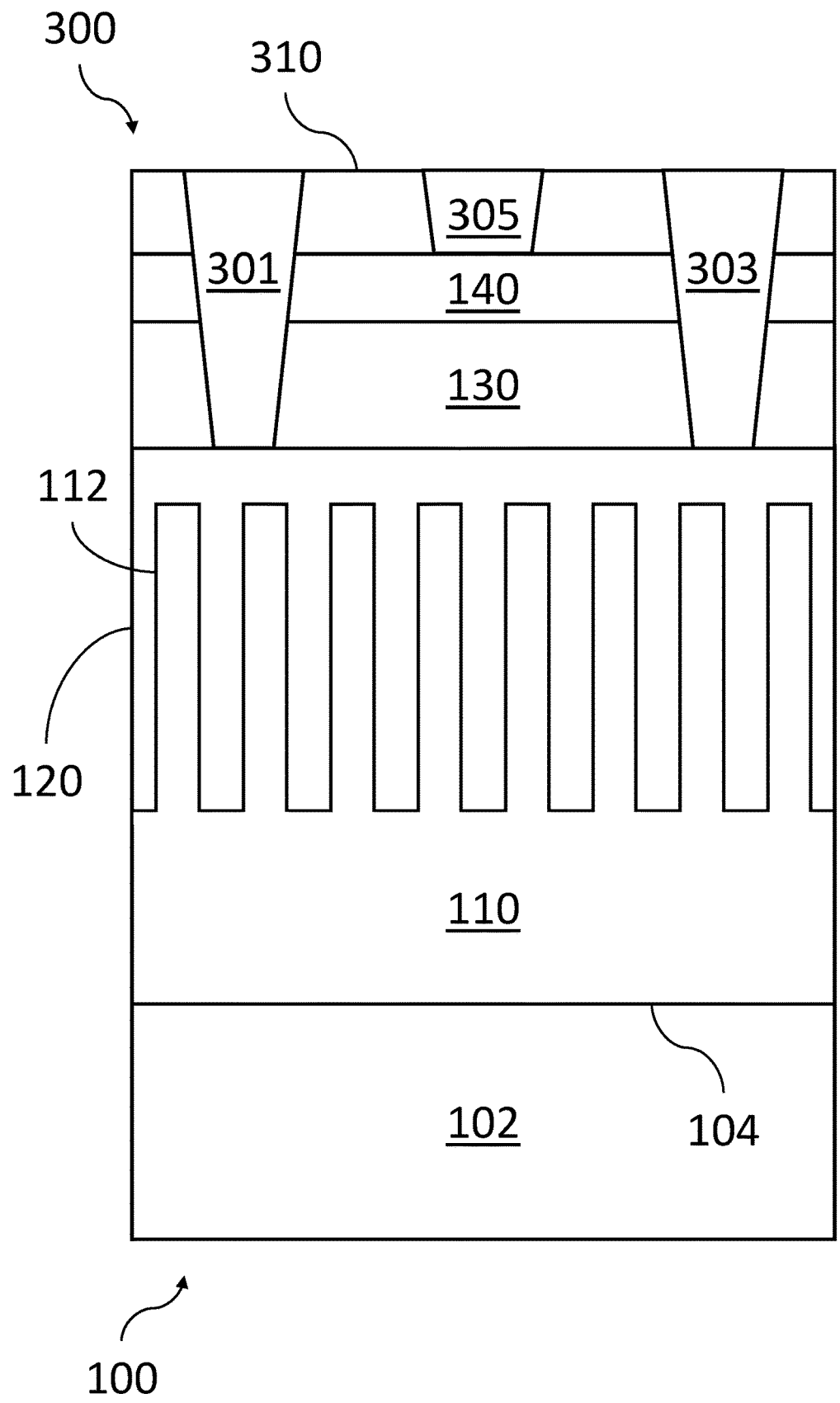

FIG. 5 illustrates a cross section of a HEMT according to the present invention.

Figure 6:
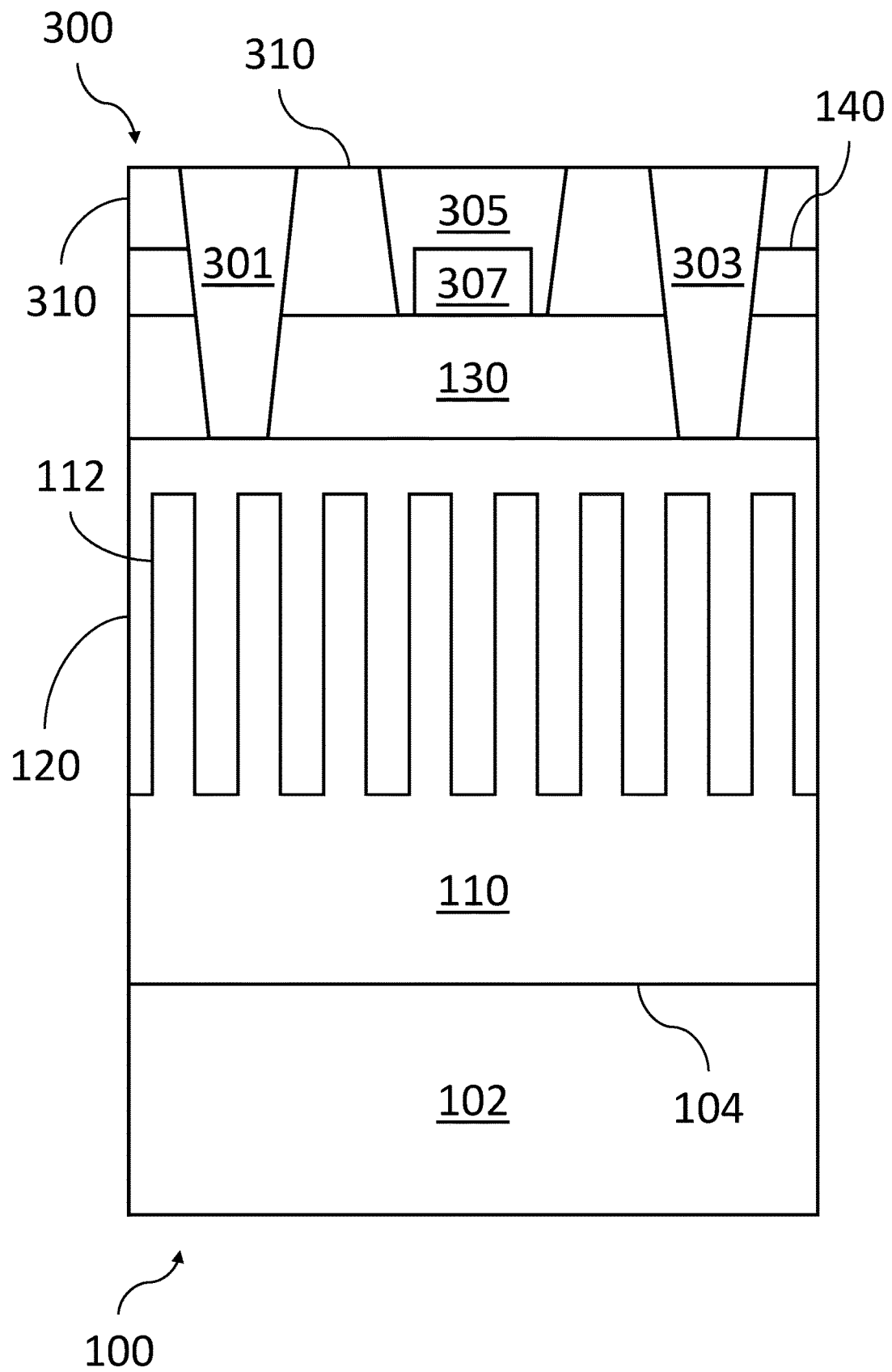

FIG. 6 illustrates a cross section of a HEMT variation.

Figure 7:
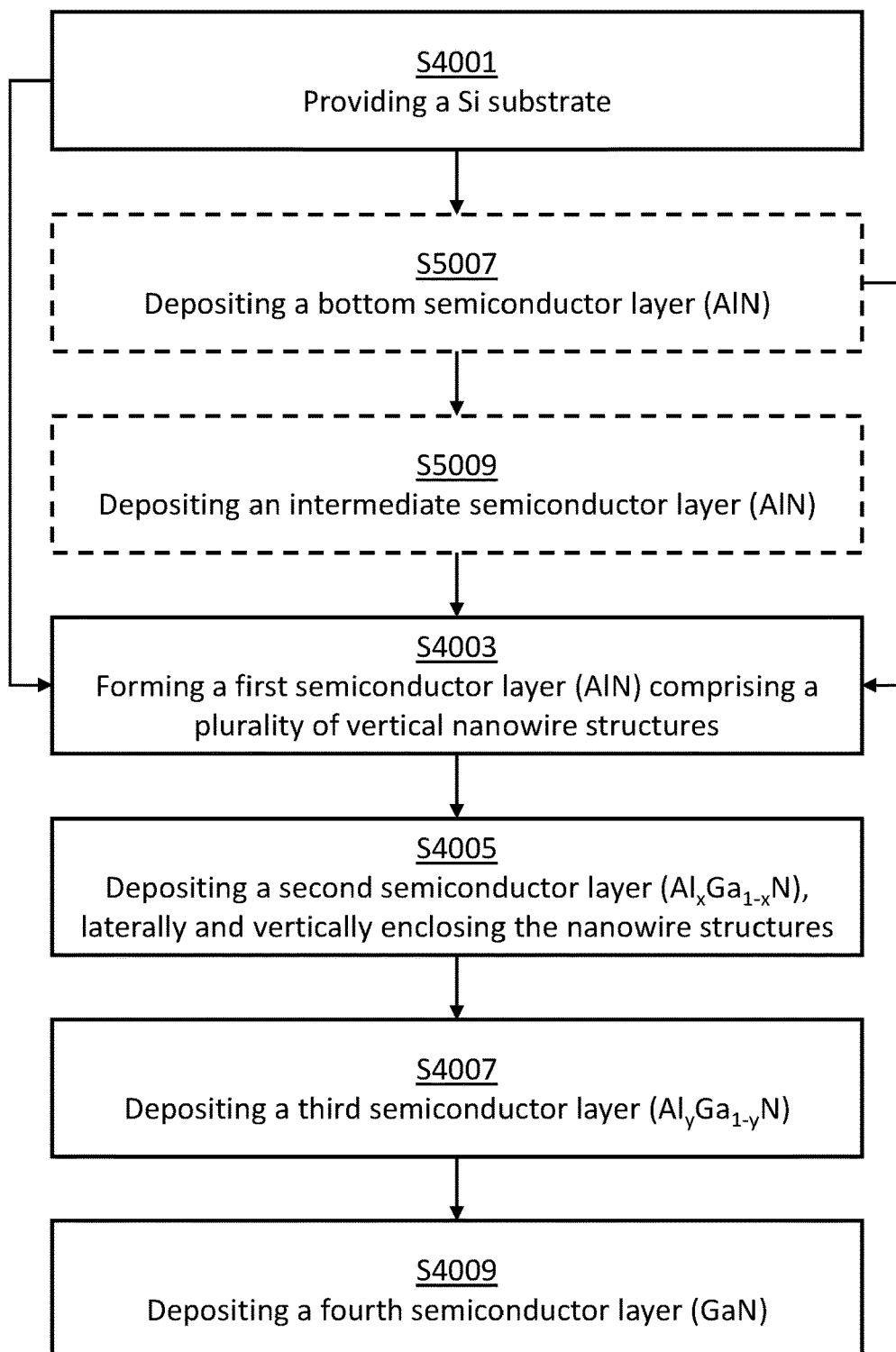

FIG. 7 shows a flowchart of a method for producing a semiconductor layer structure.

Figure 8:
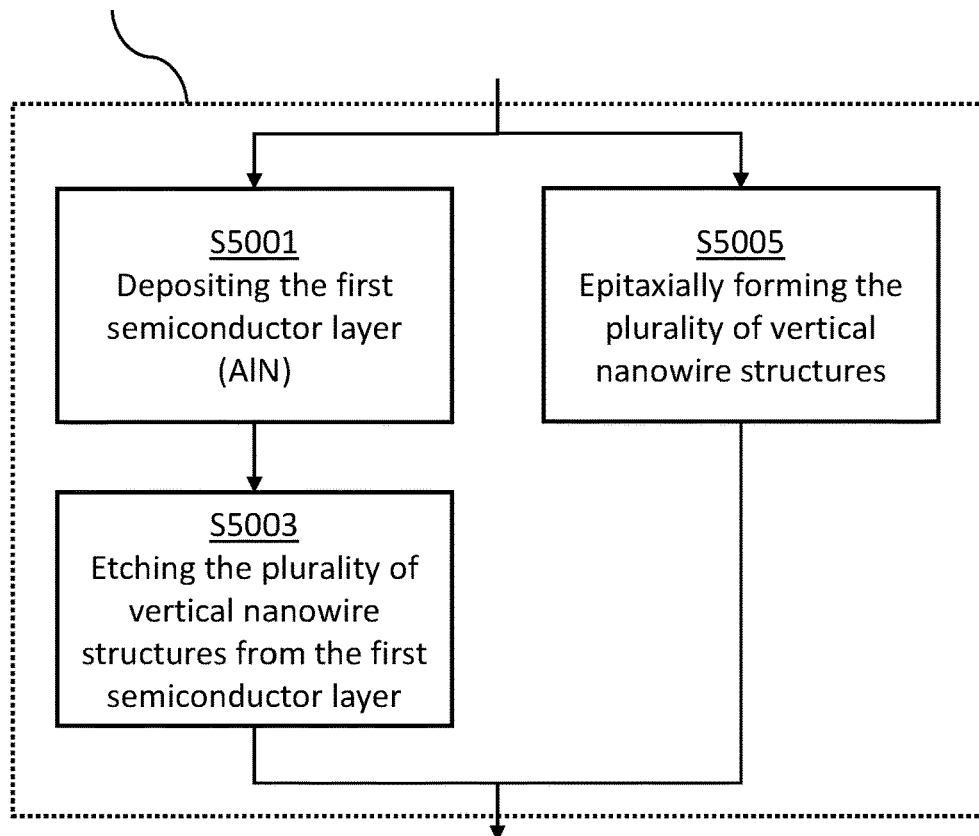

FIG. 8 shows a flowchart containing further details about steps for producing a semiconductor layer structure.

Figure 9:
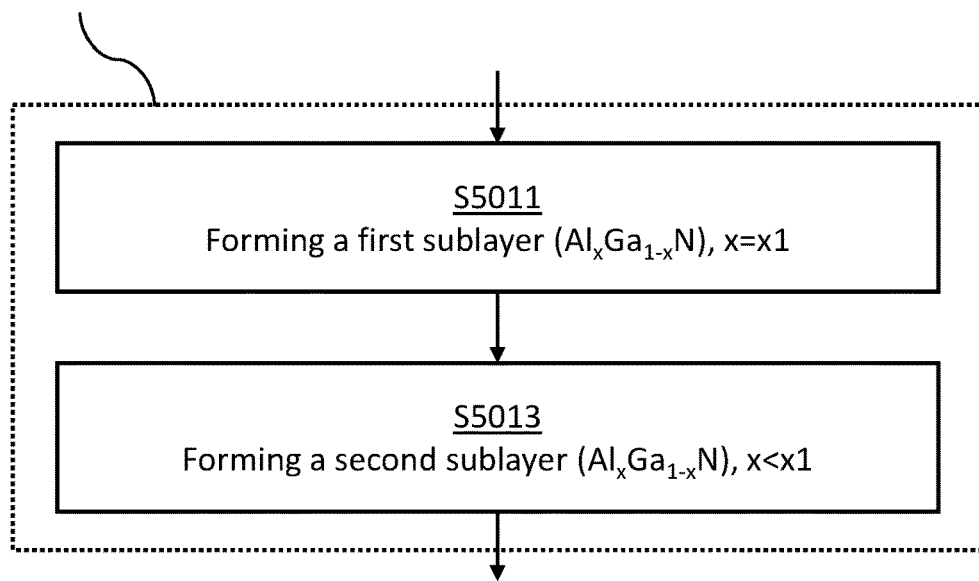

FIG. 9 shows a flowchart containing further details about steps for producing a semiconductor layer structure.

FIGS. 10a-g illustrates cross sections of a semiconductor layer structure during different chronological states of its production.

Figure 11:
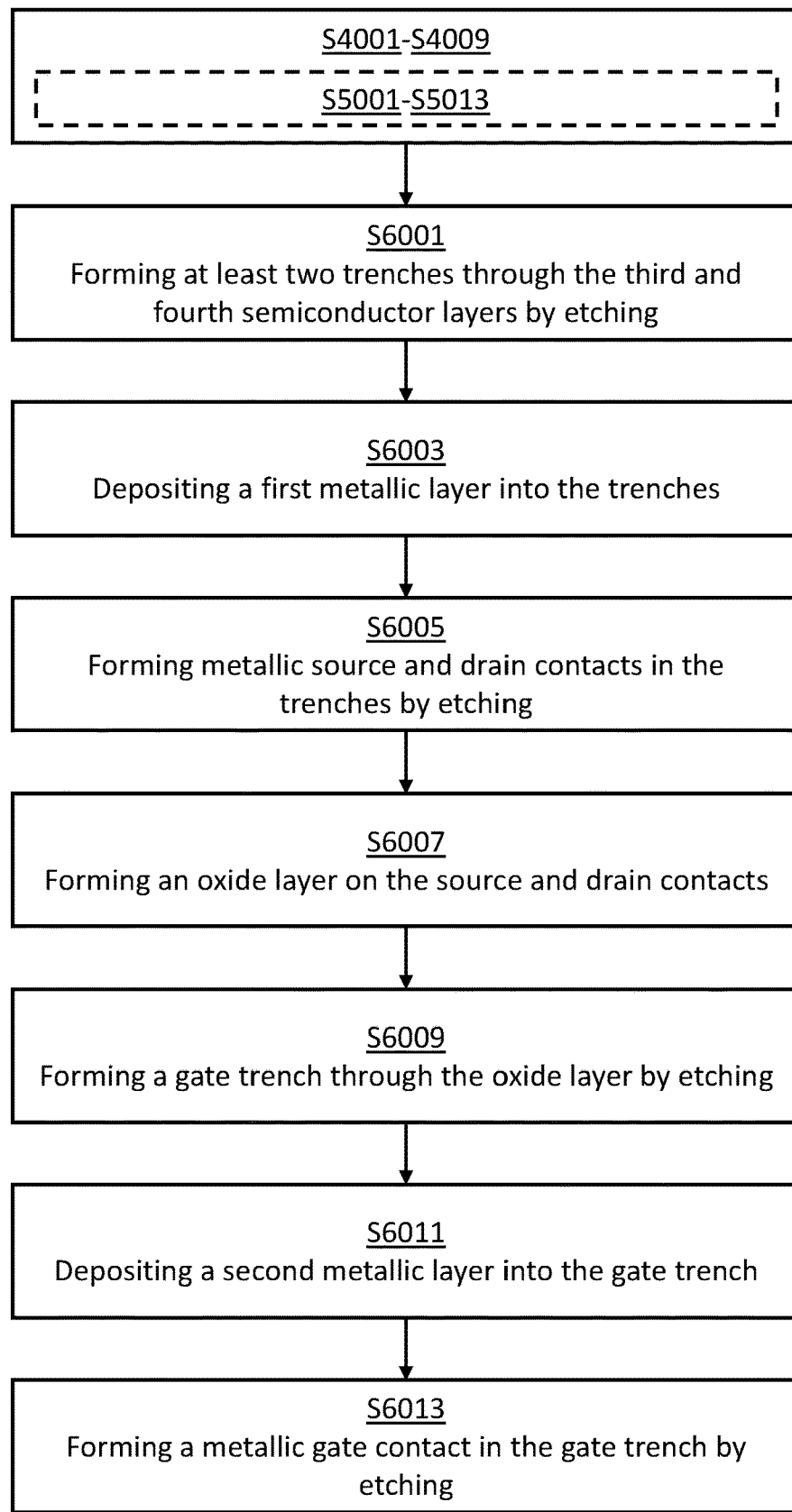

FIG. 11 shows a flowchart of a method for producing a HEMT.

FIGS. 12a-i illustrates cross sections of a HEMT during different chronological states of its production.

Figure 13:
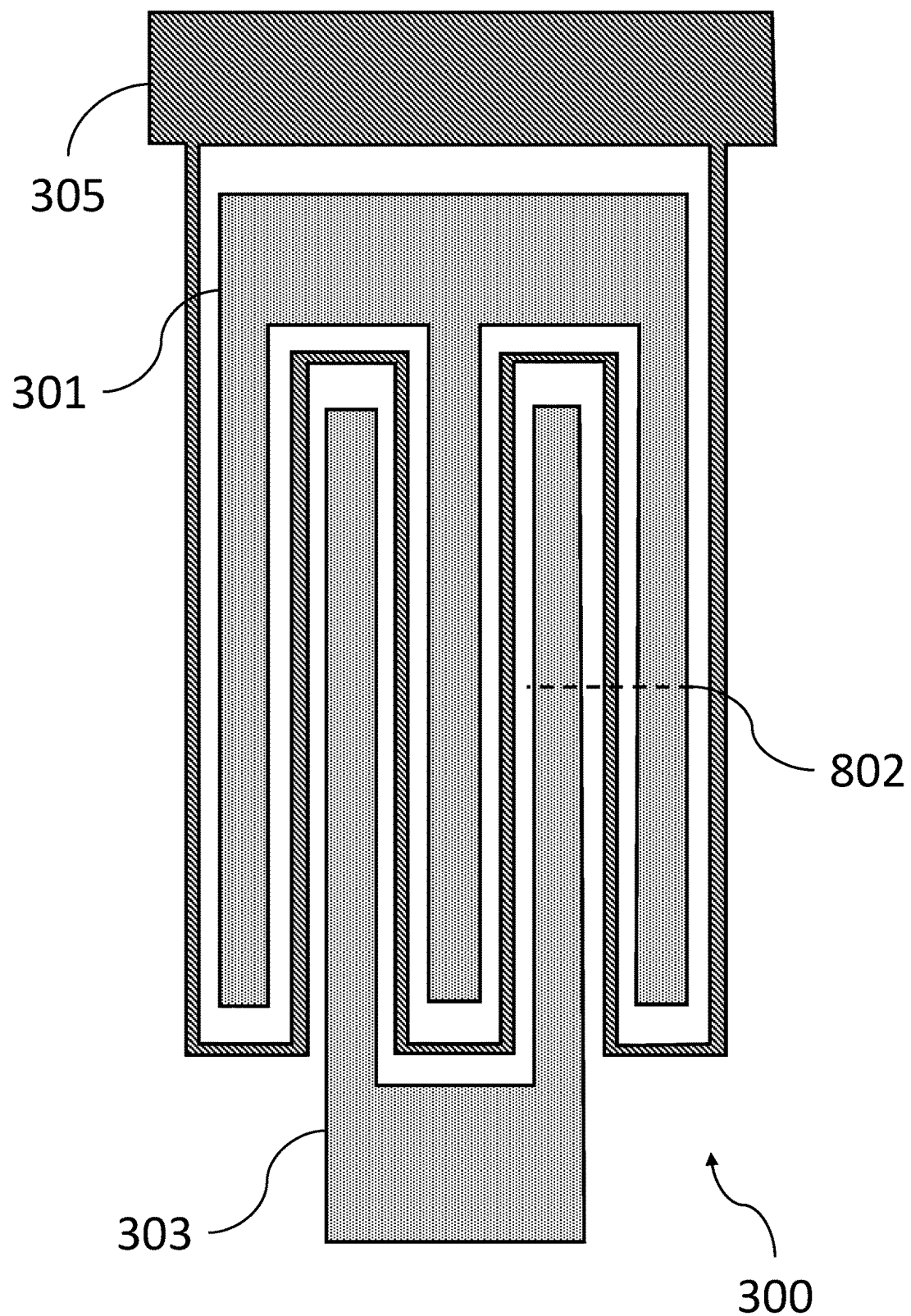

FIG. 13 shows a top view of HEMT contacts.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and to fully convey the scope of the invention to the skilled person.

In FIG. 1 there is provided a cross sectional schematic for a semiconductor layer structure 100 comprising:
  a Si substrate 102 having a top surface 104;
  a first semiconductor layer 110 arranged on said substrate 102, the first semiconductor layer 110 comprising a plurality of vertical nanowire structures 112 arranged perpendicularly to said top surface 104 of said substrate 102, the first semiconductor layer 110 comprising AlN;
  a second semiconductor layer 120 arranged on said first semiconductor layer 110 laterally and vertically enclosing said nanowire structures 112, the second semiconductor layer 120 comprising $Al_xGa_{1-x}N$, wherein $0 \le x \le 0.95$;
  a third semiconductor layer 130 arranged on said second semiconductor layer 120, the third semiconductor layer 130 comprising $Al_yGa_{1-y}N$, wherein $0 \le y \le 0.95$; and
  a fourth semiconductor layer 140 arranged on said third semiconductor layer 130, the fourth semiconductor layer 140 comprising GaN.

The top surface 104 of the Si substrate 102 may have a Miller index of {111}. The Si substrate may be considered to have the face-centered diamond-cubic crystal structure.

The Si substrate 102 and its top surface 104 may be substantially planar. The Si substrate 102 may have a vertical thickness in the range 100-1000 μm. The Si substrate 102 may more preferably have a vertical thickness in the range 275-525 μm. In general, and if not explicitly stated otherwise, thickness will herein refer to vertical thickness.

The Si substrate 102 may be in the form of a substantially circular wafer preferably with a diameter larger than or equal to 1". The wafer may more preferably have a diameter in the range 2-12" and most preferably a diameter in the range 2-4".

The first semiconductor layer 110 may preferably have a thickness in the range 100-500 nm and more preferably a thickness in the range 200-300 nm.

The vertical nanowire structures 112 of the first semiconductor layer 110 may preferably have a vertical length in the range 50-500 nm and more preferably a vertical length in the range 150-250 nm.

The vertical nanowire structures 112 may preferably have a substantially circular or hexagonal lateral cross section. The vertical nanowire structures 112 may preferably have a lateral diameter in the range 5-50 nm and more preferably a lateral diameter in the range 10-30 nm.

The plurality of vertical nanowires 112 may be arranged in a repeating array pattern, as seen from the vertical direction. The repeating array pattern may be a hexagonal pattern, wherein each vertical nanowire structure 112 has six equidistant closest other vertical nanowire structures 112. The repeating array pattern may alternatively be a square pattern, wherein each vertical nanowire structure 112 has four equidistant closest other vertical nanowire structures 112. The distance to a closest other vertical nanowire structure 112 may preferably be in the range 10-500 nm. The closest distance may more preferably be in the range 50-200 nm. This closest distance may alternatively be understood as the spacing between vertical nanowire structures 112.

The second semiconductor layer 120 may preferably have a thickness in the range 100-500 nm and more preferably a thickness in the range 200-300 nm. The second semiconductor layer 120 may be considered to laterally enclose, encapsulate, or encompass the vertical nanowire structures 112, i.e. filling in the space between the vertical nanowire structures 112. The second semiconductor layer 120 may further be considered to vertically enclose or encapsulate the vertical nanowire structures 112, i.e. extending vertically above and covering top portions of the vertical nanowire structures.

The third and fourth semiconductor layers 130, 140 may be considered as relatively thin epilayers, i.e. epitaxially formed thin-film layers. The third semiconductor layer 130 may preferably have a thickness in the range 1-100 nm. The fourth semiconductor layer 140 may have a vertical thickness in the range 1-5 nm.

Generally, for all nitride-based layers and structures, e.g. the first to the fourth semiconductor layers 110, 120, 130, 140 as well as the vertical nanowire structures 112, the material may be considered to have the crystal structure wurtzite. The crystal structure may be aligned so that the C-plane, i.e. a plane with the Miller index {0001}, aligns with or is parallel with the top surface 104 of the Si substrate 102. The wurtzite crystal structure may additionally be considered for all further nitride-based layers and structures disclosed herein. A preferred crystal orientation for GaN thin-films, e.g. the fourth semiconductor layer 140, may correspond to the wurtzite C-direction in such a way that a perpendicular C-plane may be obtained at an external surface of the thin-film. Such a C-plane surface may be considered an advantageous base for processing or fabricating many types of devices such as e.g. HEMTs and light-emitting diodes, LEDs, FIG. 2 shows the semiconductor layer structure 100 further comprising a bottom semiconductor layer 210, arranged intermediate to the top surface 104 of the substrate 102 and the first semiconductor layer 110, the bottom semiconductor 210 layer comprising AlN.

The bottom semiconductor layer 210 may preferably have a thickness in the range 10-100 nm.

FIG. 3 shows the semiconductor layer structure 100 further comprising an intermediate semiconductor layer 220, arranged intermediately to the bottom semiconductor layer 210 and the first semiconductor layer 110, the intermediate semiconductor layer 220 comprising AlN.

The intermediate semiconductor layer 220 may preferably have a thickness in the range 10-100 nm.

FIG. 4 shows the second semiconductor 120 layer comprising at least two vertically arranged sublayers 121,122, wherein x for a first sublayer 121 is greater than x for a second sublayer 122, wherein the second sublayer 122 is located further from the substrate than the first sublayer 121.

One exemplary second semiconductor layer 120 may comprise three vertically arranged sublayers. A bottommost sublayer, i.e. the sublayer closest to the substrate 102, may feature x=0.9. A topmost sublayer, i.e. the sublayer furthest from the substrate 102, may feature x=0.2. An intermediate sublayer, i.e. the sublayer between the topmost and bottommost sublayers, may feature x=0.5.

The sublayers 121, 122 may each have a thickness in the range 20-250 nm.

In FIG. 5 there is provided a cross sectional schematic for a high-electron-mobility transistor device, 300 comprising:
 the semiconductor layer structure 100;
 a metallic source contact 301 arranged directly adjacent on the second semiconductor layer 120;
 a metallic drain contact 303 arranged directly adjacent on the second semiconductor layer 120, wherein the drain contact 303 is separate from the source contact 301; and
 a metallic gate contact 305 arranged on the fourth semiconductor layer 140, wherein the gate contact 305 is arranged laterally between the source and drain contacts 301, 303, and wherein the gate contact 305 is separate from the source and drain contacts 301, 303.

The source and drain contacts 301, 303 may comprise metal materials such as Ti, Al, Cu, Ni, and/or Au. The source and drain contacts 301, 303 may comprise compounds or alloys such as e.g. AlCu.

The gate contact 305 may, in addition to the materials mentioned for the source and drain contacts 301, 303, comprise Pd and/or Au. As for the source and drain contacts 301, 303, compounds and alloys are also options for the gate contact 305.

The HEMT 300 may further comprise an oxide layer 310 arranged on the semiconductor layers 130, 140. The oxide layer 310 may be configured to feature a low relative permittivity material to reduce parasitic capacitances between the source, drain, and gate contacts 301, 303, 305. The oxide layer may comprise $SiO_2$, or other types of Si-based oxides.

The third semiconductor layer, comprising $Al_yGa_{1-y}N$, may be considered a barrier layer of the HEMT 300.

FIG. 6 shows the fourth semiconductor layer 140 being arranged as a vertical fin 307, wherein the vertical fin 307 is arranged directly adjacent on the third semiconductor layer 130, wherein the gate contact 305 is arranged to laterally and vertically enclose the vertical fin 307, and wherein the vertical fin 307 comprises p-doped GaN. The vertical fin 307 may be etched out of the fourth semiconductor layer 140. The vertical fin 307 may be understood as a laterally elongated fin or alternatively as a laterally shorter mesa structure.

Impurity atoms, for p-doping of GaN, may comprise elements from the second group of the periodic table of elements e.g. Mg. Impurities may be activated through e.g. thermal processing/annealing or electron bombardment/irradiation. The fourth semiconductor layer 140 may further not form a continuous layer between the source, drain and gate contacts 301, 303, 305, as in the case of FIG. 5.

In FIG. 7 there is provided a flowchart for a method for producing a semiconductor layer structure 100, the method comprising:

provviding S4001 a Si substrate 102 comprising a top surface 104;

forming S4003 a first semiconductor layer 110 on said substrate 102, the first semiconductor layer 110 comprising a plurality of vertical nanowire structures 112, arranged perpendicularly to said top surface 104 of said substrate 102, the first semiconductor layer 110 comprising AlN;

depositing S4005 a second semiconductor layer 120 on the substrate structure 102, laterally and vertically enclosing said nanowire structures 112, wherein the second semiconductor layer 120 comprises $Al_xGa_{1-x}N$, wherein $0 \leq x \leq 0.95$;

depositing S4007 a third semiconductor layer 130 on said second semiconductor layer 120, the third semiconductor layer 130 comprising $Al_yGa_{1-y}N$, wherein $0 \leq y \leq 0.95$; and depositing S4009 a fourth semiconductor layer 140 on said third semiconductor layer 130, the fourth semiconductor layer 140 comprising GaN.

The Si substrate 102 may be formed using conventional Si wafer production methods including e.g. the aforementioned Czochralski process.

The first semiconductor layer 110 may be formed S4003 using physical vapor deposition, PVD, chemical vapor deposition, CVD, plasma-enhanced chemical vapor deposition, PECVD, metalorganic chemical vapor deposition, MOCVD, metalorganic vapor-phase epitaxy, MOVPE, sputtering, or similar methods.

The vertical nanowire structures 112 of the first semiconductor layer 110 may be formed using etching methods such as dry etching, wet etching, chemical etching, plasma etching, reactive ion etching, etc. The etching may be performed subsequent to a patterning step aiming to define the nanowire structures 112. The vertical nanowire structures 112 may additionally be formed using epitaxy methods such as MOCVD or MOVPE, both essentially referring to the same technique. Selective area growth, based on the preceding patterning, may be employed for the nanowire structures 112.

Patterning, pattern transferring, or defining of the nanowire structures 112 may be lithography based. Optical lithography, such as ultraviolet, UV, lithography may be employed. Electron beam lithography, EBL, or nanoimprint lithography, NIL, as well as various other similar lithography methods may be employed. As an alternative, patterning may comprise just etching, or depositing, through a solid mask aligned onto, or close to, the surface of the layer or structure to be etched or deposited onto.

FIG. 7 also shows how the method may further comprise depositing S5007 a bottom semiconductor layer 210 intermediate to providing S4001 the substrate 102 and forming S4003 the first semiconductor layer 110, the bottom semiconductor layer 210 comprising AlN.

The bottom layer 210 may be deposited S5007 using similar methods as the first semiconductor layer 110. The bottom layer 120 may preferably be deposited using PVD.

FIG. 7 also shows how the method may further comprise depositing S5009 an intermediate semiconductor layer 220 intermediate to depositing S5007 the bottom semiconductor layer 210 and forming S4003 the first semiconductor layer 110, the intermediate semiconductor layer 220 comprising AlN.

The intermediate layer 220 may be deposited S5009 using similar methods as the first semiconductor layer 110. The intermediate layer 220 may preferably be deposited using high temperature MOCVD/MOVPE.

The second, third, and fourth semiconductor layers 120, 130, 140 may be deposited S4005, S4007, S4009 using MOCVD/MOVPE. Different precursor gas pressure and temperatures may be used to create solid crystal material of different compositions ranging from AlN, through various compositions of AlGaN, to GaN. It is preferred to use a temperature equal or higher than 1000° C. for the GaN MOCVD/MOVPE.

Precursor gases may comprise trimethylaluminium, TMAl, triethylaluminium, TEAl, trimethylgallium, TMGa, triethylgallium, TEGa, phenyl hydrazine, dimethylhydrazine, DMHy, tertiarybutylamine, TBAm, ammonia, $NH_3$.

The step of depositing S4005 a second semiconductor layer 120 may be understood as epitaxially growing a shell, or shells, laterally or radially out, from the vertical nanowire structures 112, in the M-direction of the wurtzite crystal of the vertical nanowire structures 112. The shell, or shells, from different vertical nanowire structures 112 may coalesce to form a common thin-film being the second semiconductor layer 120.

FIG. 8 shows how forming said plurality of vertical nanowire structures 112 of said first semiconductor layer 110 may comprise:

depositing S5001 the first semiconductor layer 110 on the substrate 102; and etching S5003 the plurality of vertical nanowire structures 112 from the first semiconductor layer 110.

The etching S5003 may be a selective etching procedure, e.g. based on a preceding patterning step. The etching S5003 may produce the vertical nanowire structures 112. The etching S5003 may be e.g. a chlorine-based plasma etching procedure.

FIG. 8 further shows how forming said plurality of vertical nanowire structures 112 may comprise epitaxially, e.g. through selective area growth MOCVD/MOVPE, forming S5005 the plurality of vertical nanowire structures 112 on the substrate 102.

FIG. 9 shows how forming said second semiconductor layer 120 may comprise:

forming S5011 a first sublayer 121 on the first semiconductor layer 110; and forming S5013 a second sublayer 122 on the first sublayer 121, wherein x for the first sublayer 121 is greater than x for the second sublayer 122.

Differences in composition of the sublayers 121, 122 may be achieved by gradually changing parameters such as temperature and precursor gas pressure.

FIGS. 10a-g show cross sectional views at different chronological stages of the method for producing the semiconductor layer structure.

FIG. 10a shows just the provided S4001 substrate 102, with its top surface 104.

FIG. 10b shows a bottom semiconductor layer 210 deposited S5007 onto the top surface 104 of the substrate 102.

FIG. 10c shows an intermediate semiconductor layer 220 deposited S5009 onto the bottom semiconductor layer 210.

FIG. 10d shows the first semiconductor layer 110, including the vertical nanowires structures 112, formed S4003 onto the intermediate semiconductor layer 220. Note that the first semiconductor layer 110 may be formed S4003 directly onto the top surface 104 of the substrate 102.

FIG. 10e shows the second semiconductor layer 120 deposited S4005 onto the first semiconductor layer 110, laterally and vertically enclosing the nanowire structures 112.

FIG. 10f shows the third semiconductor layer 130 deposited S4007 onto the second semiconductor layer 120.

FIG. 10g shows a completed semiconductor layer structure 100 with the fourth semiconductor layer 140 deposited S4009 onto the third semiconductor layer 130.

In FIG. 11 there is provided a flowchart for a method for producing a high-electron-mobility transistor device 300, the method comprising:

the steps S4001-S4009, and optionally also steps S5001-S5013, of the method for producing a semiconductor layer structure 100;
forming S6001 at least two trenches 702 through the third and fourth semiconductor layers 130, 140 by etching away portions of said third and fourth semiconductor layers 130, 140;
depositing S6003 a first metallic layer 704 into the trenches 702 and on the second semiconductor layer 120;
forming S6005 a metallic source contact 301 and a metallic drain contact 303, in the trenches 702, by etching away portions of the first metallic layer 704;
forming S6007 an oxide layer 310 on the source and drain contacts 301, 303;
forming S6009 a gate trench 708 through the oxide layer 310, between and separate from the at least two trenches 702 through the third and fourth semiconductor layers 130, 140, by etching away a portion of the oxide layer 310;
depositing S6011 a second metallic layer 710 into the gate trench 708; and
forming S6013 a metallic gate contact 305, in the gate trench 708, by etching away portions of the second metallic layer 710.

The forming S6001 of the at least two trenches 702, as well as the forming S6009 of the gate trench 708 may comprise selective etching based on patterning, as described in the above. Patterning may be performed similar for all trenches 702, 708 but etching may need to be customized according to the material to be etched. E.g. a plasma-based etching may be used for forming S6001 the at least two trenches 702 through the third and fourth semiconductor layers 130, 140. An oxide etch method, e.g. hydrofluoric acid, HF, wet etch, may be used for forming S6009 the gate trench 708 through the oxide layer 310. The trenches 702, 708 may be understood as laterally elongated trenches or alternatively as laterally shorter pits.

The depositing S6003, S6011 of first and second metallic layers 704, 708 may be performed by e.g. sputtering or metal evaporation. When deposited, the first metallic layer 704 may comprise the same materials as described in the above in relation to the metallic source and drain contacts 301, 303. When deposited, the second metallic layer 708 may comprise the same materials as described in the above in relation to the metallic gate contact 305.

The forming S6005, S6013 of the source, drain, and gate contacts 301, 303, 305 may be performed by etching the first and second metallic layers 704, 708 using a metal etch method suitable for the metallic material to be etched. Once again, etching may be mediated through a patterning step to define areas of the layer to remove. Such a patterning step may be performed in accordance with above mentioned methods of patterning.

The forming S6007 of the oxide layer 310 may comprise deposition such an oxide layer 310 through deposition methods described in the above. E.g. CVD, PECVD and sputtering may be utilized for forming the oxide layer 310.

FIGS. 12a-g show cross sectional views at different chronological stages of the method for producing the HEMT 300.

FIG. 12a shows a semiconductor layer structure 100, being the base for a following steps of producing the HEMT 300.

FIG. 12b shows the at least two trenches 702 formed S6001 through the third and fourth semiconductor layers 130, 140.

FIG. 12c shows the first metallic layer 704 deposited S6003 into the trenches 702, onto the second semiconductor layer 120.

FIG. 12d shows the metallic source and drain contacts 301, 303 formed S6005 in the trenches 702 by selective removal of portions of the first metallic layer 704 that initially physically connected the source and drain contacts 301, 303.

FIG. 12e shows the oxide layer 301 formed S6007 onto source and drain contacts 301, 303 and the semiconductor layers.

FIG. 12f shows the gate trench 708 formed S6009 through the oxide layer 310, laterally between the source and drain contacts 301, 303.

FIG. 12g shows the second metallic layer 710 deposited S6011 into the gate trench 708, onto the fourth semiconductor layer 140.

FIG. 12h the metallic gate contacts 305 formed S60013 in the gate trench 708 by selective removal of portions of the second metallic layer 710. The HEMT 300 may now be considered complete.

FIG. 12i shows an additional step of planarizing the top portions of the HEMT 300. This may be done in order to simplify access to the source and drain contacts 301, 303 and reduce interconnect complexity. Chemical mechanical polishing, CMP, may be utilized for such a planarizing step.

Additionally, variations to the disclosed embodiments can be understood and effected by the skilled person in practicing the claimed invention, from a study of the drawings, the disclosure, and the appended claims.

FIG. 13 shows a top view of a HEMT 300 contact layout. The source contact 301, the drain contact 303, and the gate contact 305, are herein arranged in a multi-finger layout. The source contact 301 has three fingers and the drain contact has two fingers. The gate contact 305 is shown to meander between the source and drain contacts 301, 303. A HEMT device cross section, as e.g. the one shown in FIG. 5, may be understood to correspond with the cross section 802 indicated in FIG. 13.

The layout furthers efficient area spacing of devices and evenly distributed electric currents. The layout allows for higher currents due to a longer effective channel width. The effective channel width may be understood as the total number of fingers (both source and drain) minus one, all multiplied with the length of one finger. The layout may also reduce the gate resistance and prevent a low-pass filter to form with the gate channel capacitance. Hence HEMT switching speed is improved by such a layout.

The invention claimed is:

1. A method for producing a semiconductor layer structure, the method comprising:
providing a Si substrate comprising a top surface;
forming a first semiconductor layer on the substrate, the first semiconductor layer comprising a plurality of vertical nanowire structures, arranged perpendicularly to the top surface of the substrate, the first semiconductor layer comprising AlN, epitaxially growing a second semiconductor layer which laterally and vertically encloses the plurality of vertical nanowire structures thereby encapsulating dislocations in shells around individual vertical nanowire structures, wherein the second semiconductor layer comprises $Al_xGa_{1-x}N$, wherein $0 \leq x \leq 0.95$.

2. The method of claim 1, wherein epitaxially growing the second semiconductor layer comprises epitaxially growing shells from the vertical nanowire structures in an M-direction of the wurtzite crystal structure.

3. The method of claim 2, wherein shells from different individual vertical nanowire structures unite laterally into a thin-film that starts to grow in a C-direction of the wurtzite crystal structure for forming the second semiconductor layer.

4. The method of claim 1, wherein forming the first semiconductor layer comprises:
depositing the first semiconductor layer on the substrate by one or more of:
physical vapor deposition, PVD,
chemical vapor deposition, CVD,
plasma-enhanced chemical vapor deposition, PECVD,
metalorganic chemical vapor deposition, MOCVD, and
metalorganic vapor-phase epitaxy, MOVPE; and
etching the plurality of vertical nanowire structures from the first semiconductor layer.

5. The method of claim 1, wherein forming the first semiconductor layer comprises epitaxially forming the plurality of vertical nanowire structures.

6. The method of claim 1, wherein the second semiconductor layer is made from GaN.

7. The method of claim 1, further comprising depositing a third semiconductor layer on the second semiconductor layer, the third semiconductor layer comprising $Al_yGa_{1-y}N$, wherein $0 \leq y \leq 0.95$.

8. The method of claim 7, further comprising depositing a fourth semiconductor layer on said third semiconductor layer, the fourth semiconductor layer comprising GaN.

9. The method of claim 1, wherein the top surface of the Si substrate has a Miller index of {111}.

10. The method of claim 1, wherein forming the first semiconductor layer comprises forming the plurality of vertical nanowire structures such that they have a vertical length in the range of 50-500 nm.

11. The method of claim 1, wherein forming the first semiconductor layer comprises forming the plurality of vertical nanowire structures such that they have a vertical length in the range of 150-250 nm.

12. The method of claim 1, wherein forming the first semiconductor layer comprises forming the plurality of vertical nanowire structures such that they have a lateral diameter in the range of 5-50 nm.

13. The method of claim 1, wherein forming the first semiconductor layer comprises forming the plurality of vertical nanowire structures such that they have a lateral diameter in the range of 10-30 nm.

14. The method of claim 1, wherein forming the first semiconductor layer comprises forming the plurality of vertical nanowire structures such that they are arranged in a repeating array pattern.

15. The method of claim 14, wherein the repeating array pattern is a hexagonal pattern, wherein a vertical nanowire structure has six equidistant closest other vertical nanowire structures.

16. The method of claim 14, wherein the repeating array pattern is a square pattern, wherein a vertical nanowire structure has four equidistant closest other vertical nanowire structures.

17. The method of claim 1, wherein a distance between individual vertical nanowire structure is in the range of 10-500 nm.

18. The method of claim 1, wherein a distance between individual vertical nanowire structure is in the range of 50-200 nm.

19. The method of claim 1, wherein growing the second semiconductor layer is made such that it covers top portions of the plurality of vertical nanowire structures.

20. A method for producing a high-electron-mobility transistor device, the method comprising:
producing a semiconductor layer structure by:
providing a Si substrate comprising a top surface,
forming a first semiconductor layer on the substrate, the first semiconductor layer comprising a plurality of vertical nanowire structures, arranged perpendicularly to the top surface of the substrate, the first semiconductor layer comprising AlN,
epitaxially growing a second semiconductor layer which laterally and vertically encloses the plurality of vertical nanowire structures thereby encapsulating dislocations in shells around individual vertical nanowire structures, wherein the second semiconductor layer comprises $Al_xGa_{1-x}N$, wherein $0 \leq x \leq 0.95$,
depositing a third semiconductor layer on the second semiconductor layer, the third semiconductor layer comprising $Al_yGa_{1-y}N$, wherein $0 \leq y \leq 0.95$, and
depositing a fourth semiconductor layer on said third semiconductor layer, the fourth semiconductor layer comprising GaN;
the method further comprising:
forming at least two trenches through the third and fourth semiconductor layers by etching away portions of said third and fourth semiconductor layers;
depositing a first metallic layer into the trenches and on the second semiconductor layer;
forming a metallic source contact and a metallic drain contact, in the trenches, by etching away portions of the first metallic layer;
forming an oxide layer on the source and drain contacts;
forming a gate trench through the oxide layer, between and separate from the at least two trenches through the third and fourth semiconductor layers, by etching away a portion of the oxide layer;
depositing a second metallic layer into the gate trench; and
forming a metallic gate contact, in the gate trench, by etching away portions of the second metallic layer.

* * * * *